US007446607B2

(12) United States Patent
Jung et al.

(10) Patent No.: US 7,446,607 B2
(45) Date of Patent: Nov. 4, 2008

(54) REGULATED CASCODE CIRCUIT, AN AMPLIFIER INCLUDING THE SAME, AND METHOD OF REGULATING A CASCODE CIRCUIT

(75) Inventors: Mu-Kyeng Jung, Suwon-si (KR); Jae-Whui Kim, Yongin-si (KR); Bai-Sun Kong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 11/799,993

(22) Filed: May 3, 2007

(65) Prior Publication Data

US 2008/0007338 A1    Jan. 10, 2008

(30) Foreign Application Priority Data

May 4, 2006    (KR) .................. 10-2006-0040289

(51) Int. Cl.
*H03F 3/45*    (2006.01)
(52) U.S. Cl. ........................... 330/253; 330/255
(58) Field of Classification Search ............... 330/253, 330/255, 261
See application file for complete search history.

(56) References Cited

U.S. PATENT DOCUMENTS

| | | | |
|---|---|---|---|
| 6,778,014 B2 * | 8/2004 | Rennig | .................. 330/253 |
| 6,804,305 B1 | 10/2004 | Chan | |
| 6,806,743 B2 | 10/2004 | Saito et al. | |
| 7,119,616 B2 * | 10/2006 | Benzer | .................. 330/252 |
| 7,183,850 B2 * | 2/2007 | Pessl | .................. 330/255 |
| 7,209,005 B2 * | 4/2007 | Martins | .................. 330/255 |

FOREIGN PATENT DOCUMENTS

| | | |
|---|---|---|
| JP | 2001-085957 | 3/2001 |
| JP | 2003-249829 | 9/2003 |

* cited by examiner

*Primary Examiner*—Henry K Choe
(74) *Attorney, Agent, or Firm*—Mills & Onello LLP

(57) ABSTRACT

A regulated cascode circuit includes a first PMOS FET and a second PMOS FET connected in series between a first terminal that receives a first supply voltage and an output terminal, a first NMOS FET and a second NMOS FET connected in series between the output terminal and a second terminal that receives a second supply voltage, and a regulation circuit. The regulation circuit outputs a first control signal for stabilizing a voltage at a drain of the first PMOS FET to a gate of the second PMOS FET based on a voltage of the drain of the first PMOS FET and outputs a second control signal for stabilizing a voltage change in a source of the first NMOS FET to a gate of the first NMOS FET based on a voltage of the source of the first NMOS FET.

14 Claims, 4 Drawing Sheets

REGULATED CASCODE CIRCUIT, AN AMPLIFIER INCLUDING THE SAME, AND METHOD OF REGULATING A CASCODE CIRCUIT

This application claims priority under 35 U.S.C. § 119 from commonly owned Korean Patent Application No. 10-2006-0040289, filed on May 4, 2006 in the Korean Intellectual Property Office, the disclosure of which is hereby incorporated by reference herein as if set forth in its entirety.

BACKGROUND OF THE INVENTION

1. Field of the Invention

The present invention relates to a cascode circuit, and more particularly, to a cascode circuit operating at less than 1 V (i.e., sub-1 V) and an amplifier including the same.

2. Description of the Related Art

Cascode circuits are usually used for circuit applications requiring high output impedance (or resistance).

Figure 1:
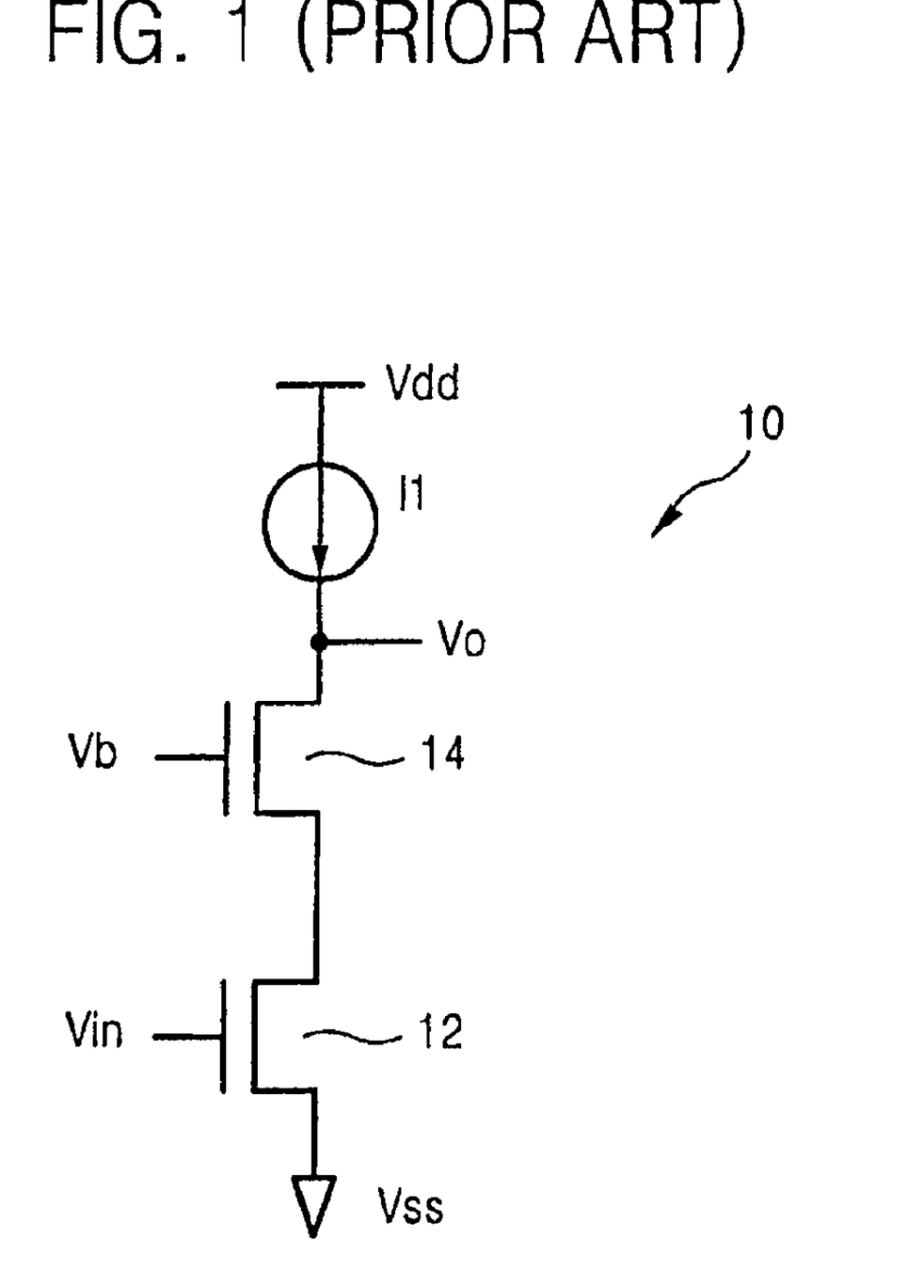
FIG. 1 illustrates a conventional cascode circuit.

FIG. 1 illustrates a conventional cascode circuit 10 that includes a current source I1, a first N-channel metal-oxide semiconductor field-effect transistor (NMOS FET) 12, and a second NMOS FET 14. The cascode circuit 10 amplifies an input voltage Vin to generate an output voltage Vo. To allow constant current to flow in the second NMOS FET 14, a bias voltage Vb is applied to a gate of the second NMOS FET 14.

Since the first NMOS FET 12 and the second NMOS FET 14 are connected in series in a stack structure, the output resistance of the cascode circuit 10 is always high at a drain (i.e., an output terminal Vo) of the second NMOS FET 14.

However, satisfactorily high output resistance can not be obtained with only the cascode circuit 10 because a channel length modulation effect is reduced due to the scale-down of semiconductor processes.

Figure 2:
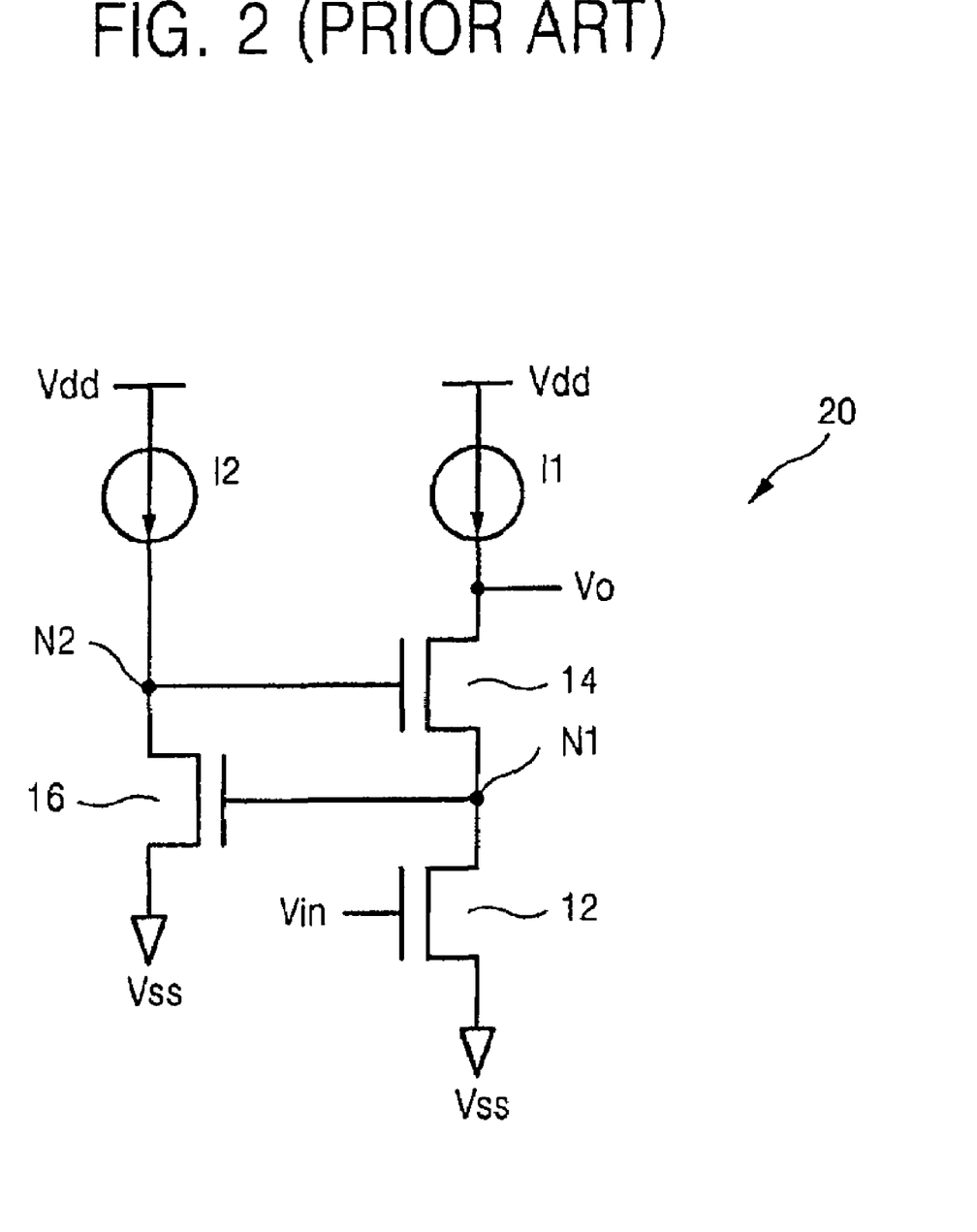
FIG. 2 illustrates a conventional regulated cascode circuit.

FIG. 2 illustrates a conventional regulated cascode circuit 20 that includes a gate of a third NMOS FET 16 connected to a node N1 and a gate of the second NMOS FET 14 connected to a node N2. The output resistance of the regulated cascode circuit 20 is several tens of times higher than that of the cascode circuit 10. However, since the regulated cascode circuit 20 has a loss in an output voltage swing by a threshold voltage as compared to the cascode circuit 10, it is not suited for use at a low voltage of less than 1 V.

Moreover, a power supply rejection ratio (PSRR) of the regulated cascode circuit 20 is degraded due to noise in power lines receiving a power supply voltage Vdd and a ground voltage Vss, respectively. The regulated cascode circuit 20 includes the third NMOS FET 16 operating in a weak inversion region to compensate for the loss of the threshold voltage in the output voltage swing. In this case, the loss in the output voltage swing is minimized, but it is difficult to use the regulated cascode circuit 20 in other circuits due to operational instability, an increasing area, and degradation of the PSRR.

SUMMARY OF THE INVENTION

The present invention provides a regulated cascode amplifier providing an improved power supply rejection ratio (PSRR) without decreasing output resistance.

According to an aspect of the present invention, there is provided a regulated cascode circuit including a first P-channel metal-oxide semiconductor field-effect transistor (PMOS FET) and a second PMOS FET connected in series between an output terminal and a first terminal configured to receive a first supply voltage; a first N-channel metal-oxide semiconductor field-effect transistor (NMOS FET) and a second NMOS FET connected in series between the output terminal and a second terminal configured to receive a second supply voltage; and a regulation circuit. The regulation circuit is configured to output a first control signal to a gate of the second PMOS FET that is based on a voltage of a drain of the first PMOS FET, wherein the first control signal is configured to stabilize the voltage at the drain of the first PMOS FET, and to output a second control signal to a gate of the first NMOS FET based on a voltage of a source of the first NMOS FET, wherein the second control signal configured to stabilize the voltage at the source of the first NMOS FET.

A bias voltage can be input to at least one gate among a gate of the first PMOS FET and a gate of the second NMOS FET.

An input voltage can be input to a gate of the second NMOS FET.

The regulation circuit can include a first current source connected between the first terminal and a first node, a second current source connected between the second terminal and a second node, a third PMOS FET connected between the first node and the gate of the second PMOS FET, a fourth PMOS FET connected between the first node and the gate of the first NMOS FET, the fourth PMOS FET having a gate connected to the source of the first NMOS FET, a third NMOS FET connected between the second node and the gate of the second PMOS FET, the third NMOS FET having a gate connected to the drain of the first PMOS FET, and a fourth NMOS FET connected between the second node and the gate of the first NMOS FET.

A threshold voltage of each of the third PMOS FET, the fourth PMOS FET, the third NMOS FET, and the fourth NMOS FET can be equal to or higher than a threshold voltage of each of the first PMOS FET, the second PMOS FET, the first NMOS FET, and the second NMOS FET.

A bias voltage can be input to a gate of the third PMOS FET and a gate of the fourth NMOS FET.

According to another aspect of the present invention, there is provided a regulated cascode circuit including a first PMOS FET connected between a first node and a first terminal that receives a first supply voltage, the first PMOS FET having a gate that receives a first bias voltage, a second PMOS FET connected between the first node and an output node, a first NMOS FET connected between the output node and a second node, a second NMOS FET connected between the second node and a second terminal that receives a second supply voltage, the second NMOS FET having a gate that receives an input signal, a first current source connected between the first terminal and a third node, a second current source connected between the second terminal and a fourth node, a third PMOS FET connected between the third node and a gate of the second PMOS FET, the third PMOS FET having a gate that receives a second bias voltage, a fourth PMOS FET connected between the third node and a gate of the first NMOS FET, the fourth PMOS FET having a gate connected to the second node, a third NMOS FET connected between the fourth node and the gate of the second PMOS FET, the third NMOS FET having a gate connected to the first node, and a fourth NMOS FET connected between the fourth node and the first NMOS FET, the fourth NMOS FET having a gate that receives the second bias voltage.

A threshold voltage of each of the third PMOS FET, the fourth PMOS FET, the third NMOS FET, and the fourth NMOS FET can be equal to or higher than a threshold voltage of each of the first PMOS FET, the second PMOS FET, the first NMOS FET, and the second NMOS FET.

According to still another aspect of the present invention, there is provided an amplifier including a first PMOS FET, a second PMOS FET, a first NMOS FET, and a second NMOS FET connected in series between a first terminal that receives a first supply voltage and a second terminal that receives a second supply voltage; a first regulation circuit; a third PMOS FET, a fourth PMOS FET, a third NMOS FET, and a fourth NMOS FET connected in series between the first terminal and the second terminal; a second regulation circuit; and a differential amplifier. The first regulation circuit is configured to output a first control signal to a gate of the second PMOS FET based on a voltage of a drain of the first PMOS FET, wherein the first control signal is configured to stabilize the voltage at the drain of the first PMOS FET, and to output a second control signal to a gate of the first NMOS FET based on a voltage of a source of the first NMOS FET, the second control signal configured to stabilize the voltage at the source of the first NMOS FET. The second regulation circuit is configured to output a third control signal to a gate of the fourth PMOS FET based on a voltage of a drain of the third PMOS FET, wherein the third control signal configured to stabilize the voltage at the drain of the third PMOS FET, and to output a fourth control signal to a gate of the third NMOS FET based on a voltage of a source of the third NMOS FET, wherein the fourth control signal configured to stabilize the voltage at the source of the third NMOS FET. The differential amplifier is configured to output to the drain of the first PMOS FET a first differential signal from a set of differential output signals corresponding to a difference between differential input signals and outputs to the drain of the third PMOS FET a second differential signal from the set of differential output signals.

A bias voltage can be input to each gate of the first PMOS FET, the third PMOS FET, the second NMOS FET, and the fourth NMOS FET.

The first regulation circuit can include a first current source connected between the first terminal and a first node, a second current source connected between the second terminal and a second node, a fifth PMOS FET connected between the first node and the gate of the second PMOS FET, a sixth PMOS FET connected between the first node and the gate of the first NMOS FET, the sixth PMOS FET having a gate connected to the source of the first NMOS FET, a fifth NMOS FET connected between the second node and the gate of the second PMOS FET, the fifth NMOS FET having a gate connected to the drain of the first PMOS FET, and a sixth NMOS FET connected between the second node and the gate of the first NMOS FET.

A bias voltage can be input to a gate of the fifth PMOS FET and a gate of the sixth NMOS FET.

The second regulation circuit can include a third current source connected between the first terminal and a third node, a fourth current source connected between the second terminal and a fourth node, a seventh PMOS FET connected between the third node and the gate of the fourth PMOS FET, an eighth PMOS FET connected between the third node and the gate of the third NMOS FET, the eighth PMOS FET having a gate connected to the source of the third NMOS FET, a seventh NMOS FET connected between the fourth node and the gate of the fourth PMOS FET, the seventh NMOS FET having a gate connected to the drain of the third PMOS FET, and an eighth NMOS FET connected between the fourth node and the gate of the third NMOS FET.

According to another aspect of the present invention, there is provided a method of regulating a cascode circuit. The method comprises providing a first PMOS FET and a second PMOS FET connected in series between a first terminal and an output terminal, the first terminal configured for receiving a first supply voltage; providing a first NMOS FET and a second NMOS FET connected in series between the output terminal and a second terminal configured to receive a second supply voltage; and stabilizing a voltage at a drain of the first PMOS FET by outputting a first control signal to a gate of the second PMOS FET that is based on the voltage at the drain of the first PMOS FET; and stabilizing a voltage at a gate of the first NMOS FET by outputting a second control signal to a gate of the first NMOS FET that is based on the voltage at the source of the first NMOS FET.

The method can further comprise inputting a bias voltage to at least one gate among a gate of the first PMOS FET and a gate of the second NMOS FET.

The method can further comprise inputting an input voltage to a gate of the second NMOS FET.

The method of can further comprise providing a first current source connected between the first terminal and a first node; providing a second current source connected between the second terminal and a second node; providing a third PMOS FET connected between the first node and the gate of the second PMOS FET; providing a fourth PMOS FET connected between the first node and the gate of the first NMOS FET and having a gate connected to the source of the first NMOS FET; providing a third NMOS FET connected between the second node and the gate of the second PMOS FET and having a gate connected to the drain of the first PMOS FET; and providing a fourth NMOS FET connected between the second node and the gate of the first NMOS FET.

The method can further comprise defining a threshold voltage of each of the third PMOS FET, the fourth PMOS FET, the third NMOS FET, and the fourth NMOS. FET that is equal to or higher than a threshold voltage of each of the first PMOS FET, the second PMOS FET, the first NMOS FET, and the second NMOS FET.

The method can further comprise inputting a bias voltage to a gate of the third PMOS FET and a gate of the fourth NMOS FET.

According to yet another aspect of the invention, there is provided a method of amplifying an input signal. The method comprises providing a first PMOS FET, a second PMOS FET, a first NMOS FET, and a second NMOS FET connected in series between a first terminal that receives a first supply voltage and a second terminal that receives a second supply voltage; stabilizing a voltage at a drain of the first PMOS FET by outputting a first control signal to a gate of the second PMOS FET based on the voltage of the drain of the first PMOS FET, and stabilizing a voltage at a source of the first NMOS FET by outputting a second control signal to a gate of the first NMOS FET based on the voltage of the source of the first NMOS FET; providing a third PMOS FET, a fourth PMOS FET, a third NMOS FET, and a fourth NMOS FET connected in series between the first terminal and the second terminal; stabilizing a voltage at a drain of the third PMOS FET by outputting a third control signal to a gate of the fourth PMOS FET based on the voltage of the drain of the third PMOS FET, stabilizing a voltage at a source of the third NMOS FET by outputting a fourth control signal to a gate of the third NMOS FET based on the voltage of the source of the third NMOS FET; and from a differential amplifier, outputting to the drain of the first PMOS FET a first differential signal from a set of differential output signals corresponding to a difference between differential input signals and to output to the drain of the third PMOS FET a second differential signal from the set of differential output signals.

BRIEF DESCRIPTION OF THE DRAWINGS

Various aspects of the invention will become more apparent in view of the attached drawing figures, which are provided by way of example, not by way of limitation, in which.

DETAILED DESCRIPTION OF THE INVENTION

The attached drawings for illustrating preferred embodiments of the present invention are described below. This invention can, however, be embodied in many different forms and should not be construed as limited to the embodiments set forth herein. Like reference numerals in the drawings denote like elements.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprise," "comprises," "comprising," "include," "includes" and/or "including," when used in this specification and/or claims, specify the presence of stated features, integers, steps, operations, elements, and/or components, but do not preclude the presence or addition of one or more other features, integers, steps, operations, elements, components, and/or groups thereof.

It will be understood that, although the terms first, second, etc. can be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

Figure 3:
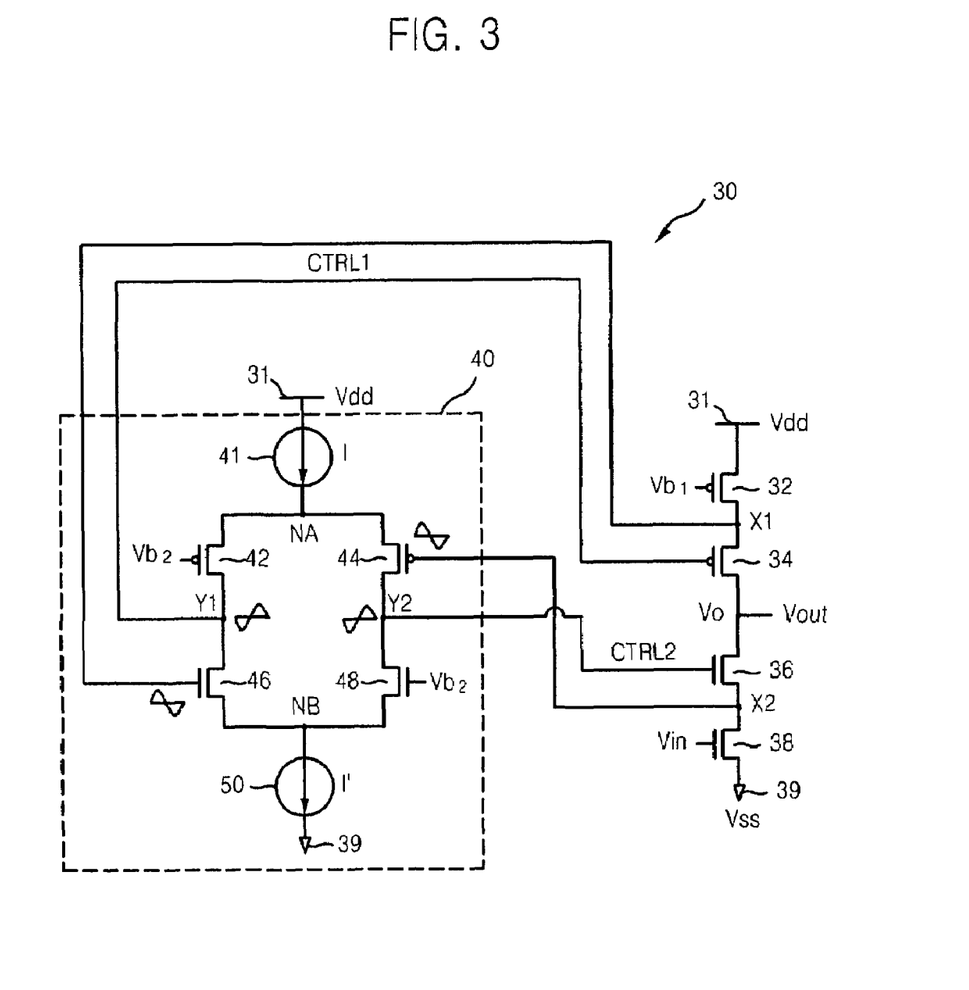
FIG. 3 illustrates an embodiment of a regulated cascode circuit according to aspects of the present invention.

FIG. 3 illustrates a regulated cascode circuit 30 according to an embodiment of the present invention. The regulated cascode circuit 30 includes a plurality of metal-oxide semiconductor field-effect transistors (MOS FETs) and a regulation circuit 40. The plurality of MOS FETs include a first P-channel MOS FET (PMOS FET) 32, a second PMOS FET 34, a first N-channel MOS FET (NMOS FET) 36, and a second NMOS FET 38.

The first PMOS FET 32 and the second PMOS FET 34 are connected in series between an output terminal Vo and a first terminal 31 receiving a first supply voltage Vdd. The first NMOS FET 36 and the second NMOS FET 38 are connected in series between the output terminal Vo and a second terminal 39 receiving a second supply voltage Vss. The first supply voltage Vdd is higher than the second supply voltage Vss. For example, the first supply voltage Vdd can be a power supply voltage and the second supply voltage Vss can be a ground voltage. The first PMOS FET 32 and the second PMOS FET 34 can be implemented in a stack structure, wherein they are connected in series. Also, the first NMOS FET 36 and the second NMOS FET 38 can be implemented in a similar stack structure.

A first bias voltage $Vb_1$ is input to a gate of the first PMOS FET 32, and therefore, constant current flows in the first PMOS FET 32. The regulated cascode circuit 30 amplifies an input signal Vin input to a gate of the second NMOS FET 38 to generate an output signal Vout. Accordingly, the regulated cascode circuit 30 can be used as an amplifier.

The regulation circuit 40 outputs a first control signal CTRL1, for stabilizing a voltage at a drain X1 of the first PMOS FET 32, to a gate of the second PMOS FET 34, wherein CTRL1 based on the voltage of the drain X1 of the first PMOS FET 32. The regulation circuit (40) also outputs a second control signal CTRL2, for stabilizing a voltage at a source X2 of the first NMOS FET 36, to a gate of the first NMOS FET 36, wherein CTRL2 is based on the voltage of the source X2 of the first NMOS FET 36.

The regulation circuit 40 includes a first current source 41, a second current source 50, and a plurality of MOS FETs 42, 44, 46, and 48. The first current source 41 is connected between a first node NA and the first terminal 31 and generates a constant current I. The second current source 50 is connected between a second node NB and the second terminal 39 and generates a constant current I'. The constant current I generated by the first current source 41 can be the same as or different from the constant current I' generated by the second current source 50.

To isolate the regulation circuit 40 from power lines, for example, at the first and second terminals 31 and 39, the regulation circuit 40 includes a pair of third and fourth PMOS FETs 42 and 44, a pair of third and fourth NMOS FETs 46 and 48, the first current source 41, and the second current source 50, and forms a virtual ground at each of the first and second nodes NA and NB. Accordingly, the regulation circuit 40 in this embodiment increases a power supply rejection ratio (PSRR) with respect to noise in the power lines (e.g., at the first and second terminals 31 and 39).

Here, the voltage of the source X2 of the first NMOS FET 36 is low enough to activate the fourth PMOS FET 44 for regulation, and therefore, the fourth PMOS FET 44 can operate in an inversion region without causing a loss in an output voltage swing. The third PMOS FET 42 is connected between the first node NA and the gate of the second PMOS FET 34. A second bias voltage $Vb_2$ is input to a gate of the third PMOS FET 42.

The fourth PMOS FET 44 is connected between the first node NA and the gate of the first NMOS FET 36 and has a gate connected to the source X2 of the first NMOS FET 36. The third NMOS FET 46 is connected between the second node NB and the gate of the second PMOS FET 34, and the third NMOS FET 46 has a gate connected to the drain X1 of the first PMOS FET 32.

The fourth NMOS FET 48 is connected between the second node NB and the gate of the first NMOS FET 36. The second bias voltage $Vb_2$ is input to a gate of the fourth NMOS FET 48. The operation of the third NMOS FET 46 is controlled based on voltage change at the drain X1 of the first PMOS FET 32 and the operation of the fourth PMOS FET 44 is controlled based on voltage change at the source X2 of the first NMOS FET 36.

Accordingly, the operation of the second PMOS FET 34 is controlled in response to the first control signal CTRL1, which is controlled by the third NMOS FET 46, and the operation of the first NMOS FET 36, which is controlled in response to the second control signal CTRL2 controlled by the fourth PMOS FET 44.

Referring to FIG. 3, when the voltage of the source X2 of the first NMOS FET 36 increases by ΔV due to noise caused by the power line (e.g., the second terminal 39) or the like, a gate voltage of the fourth PMOS FET 44 also increases by ΔV.

Accordingly, current flowing in a drain of the fourth PMOS FET 44 decreases and a gate voltage (i.e., CTRL2) of the first NMOS FET 36 also decreases. As a result, current flowing in the source X2 of the first NMOS FET 36 decreases and the voltage of the source X2 of the first NMOS FET 36 also decreases.

When the voltage of the source X2 of the first NMOS FET 36 decreases by ΔV, current flowing in the fourth PMOS FET 44 increases. In other words, the gate voltage (i.e., CTRL2) of the first NMOS FET 36 increases due to a negative feedback loop formed between the fourth PMOS FET 44 and the first NMOS FET 36.

Accordingly, since the current flowing in the first NMOS FET 36 is controlled based on the second control signal CTRL2 output from the regulation circuit 40, the voltage of the source X2 of the first NMOS FET 36 is maintained substantially constant.

In addition, when the voltage of the drain X1 of the first PMOS FET 32 increases, a gate voltage of the third NMOS FET 46 increases and current flowing in the third NMOS FET 46 also increases. Accordingly, a gate voltage of the second PMOS FET 34 increases. As a result, current flowing in the second PMOS FET 34 decreases and the voltage of the drain X1 of the first PMOS FET 32 decreases.

In other words, when the voltage of the drain X1 of the first PMOS FET 32 increases, the regulation circuit 40 outputs the first control signal CTRL1 for decreasing the voltage of the drain X1 of the first PMOS FET 32 to the gate of the second PMOS FET 34. When the voltage of the drain X1 of the first PMOS FET 32 decreases, the regulation circuit 40 outputs the first control signal CTRL1 for increasing the voltage of the drain X1 of the first PMOS FET 32 to the gate of the second PMOS FET 34. Here, the negative feedback loop is formed by the second PMOS FET 34 and the third NMOS FET 46.

Accordingly, the regulation circuit 40 outputs the first control signal CTRL1 and the second control signal CTRL2 to the gate of the second PMOS FET 34 and the gate of the first NMOS FET 36, respectively, in order to maintain or stabilize the voltage of the drain X1 of the first PMOS FET 32 and the voltage of the source X2 of the first NMOS FET 36 substantially constant.

When the threshold voltage of each of the MOS FETs 42, 44, 46, and 48 included in the regulation circuit 40 is not satisfactorily high, an operating point of the regulation circuit 40 or the regulated cascode circuit 30 can move into a linear region or an operating point of the MOS FETs 34 and 36 can move into a cutoff region. In this case, the characteristics of the regulation circuit 40 or the regulated cascode circuit 30 can be degraded. Accordingly, it is preferable that the threshold voltage of each of the MOS FETs 42, 44, 46, and 48 is equal to or greater than that of each of the MOS FETs 32, 34, 36, and 38. When a predetermined body bias is provided to a body of each of the MOS FETs 42, 44, 46, and 48, each of the MOS FETs 42, 44, 46, and 48 can have a satisfactorily high threshold voltage. Accordingly, output resistance at the output terminal Vo is several tens of times higher than output resistance of the conventional cascode circuit 10 illustrated in FIG. 1.

Figure 4:
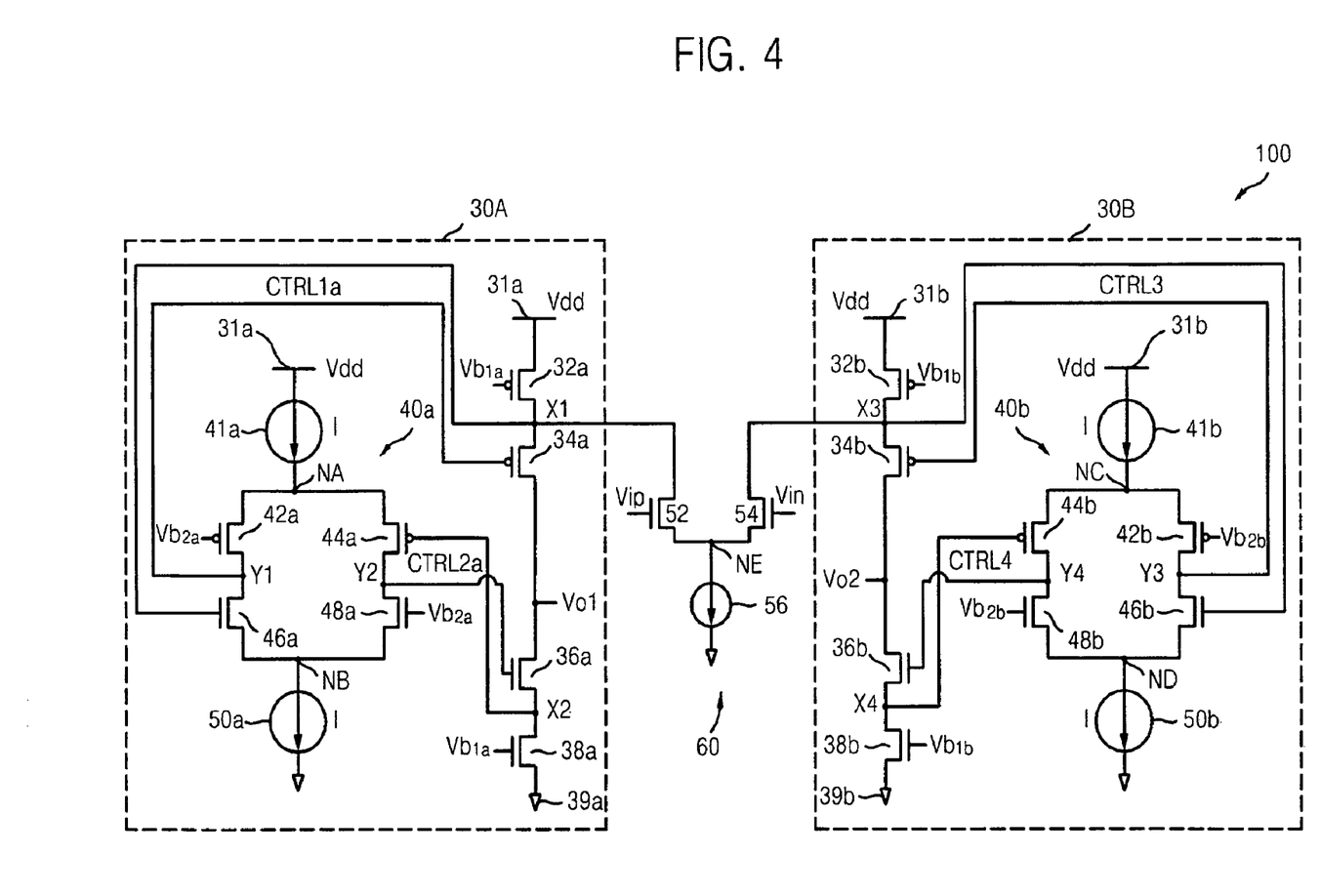
FIG. 4 is a circuit diagram of an embodiment of an amplifier including regulated cascode circuits according to aspects of the present invention.

FIG. 4 is a circuit diagram of an amplifier 100 including regulated cascode circuits according to another illustrative embodiment. The amplifier 100 includes a first cascode circuit 30A, a second cascode circuit 30B, and a differential amplifier 60. The first cascode circuit 30A and the second cascode circuit 30B substantially have the same structure as the regulated cascode circuit 30 illustrated in FIG. 3.

The first cascode circuit 30A includes a first PMOS FET 32a, a second PMOS FET 34a, a first NMOS FET 36a, a second NMOS FET 38a, and a first regulation circuit 40a.

The first PMOS FET 32a, the second PMOS FET 34a, the first NMOS FET 36a, and the second NMOS FET 38a are connected in series between the first terminal 31a receiving the first supply voltage Vdd and the second terminal 39a receiving the second supply voltage Vss. The first PMOS FET 32a and the second PMOS FET 34a can be implemented in a stack structure and the first NMOS FET 36a and the second NMOS FET 38a can be implemented in a stack structure.

The first regulation circuit 40a outputs a first control signal CTRL1a for stabilizing the voltage at a drain X1a of the first PMOS FET 32a to a gate of the second PMOS FET 34a based on a voltage of the drain X1a of the first PMOS FET, 32a. The first regulation circuit 40a also outputs a second control signal CTRL2a for stabilizing the voltage at a source X2a of the first NMOS FET 36a to a gate of the first NMOS FET 36a based on a voltage of the source X2a of the first NMOS FET 36a.

The first bias voltage $Vb_{1a}$ is input to a gate of the first PMOS FET 32a and a gate of the second NMOS FET 38a. Accordingly, constant current flows in the first PMOS FET 32a and the second NMOS FET 38a. The first bias voltage $Vb_{1a}$ or different bias voltages can be applied to the gate of the first PMOS FET 32a and the gate of the second NMOS FET 38a.

The first regulation circuit 40a includes a plurality of MOS FETs 42a, 44a, 46a, and 48a, a first current source 41a, and a second current source 50a. The first current source 41a is connected between the first terminal 31a and a first node NA and the second current source 50a is connected between the second terminal 39a and a second node NB.

The fifth PMOS FET 42a is connected between the first node NA and the gate of the second PMOS FET 34a. The sixth PMOS FET 44a is connected between the first node NA and the gate of the first NMOS FET 36a and has a gate connected to the source X2 of the first NMOS FET 36a. The fifth NMOS FET 46a is connected between the second node NB and the gate of the second PMOS FET 34a and has a gate connected to the drain X1 of the first PMOS FET 32a. The sixth NMOS FET 48a is connected between the second node NB and the gate of the first NMOS FET 36a.

The second bias voltage $Vb_{2a}$ is applied to a gate of the fifth PMOS FET 42a and a gate of the sixth NMOS FET 48a. Here, a bias voltage applied to the gate of the fifth PMOS FET 42a can be the same as or different from a bias voltage applied to the gate of the sixth NMOS FET 48a. As described above with reference to FIG. 3, the threshold voltage of each of the MOS FETs 42a, 44a, 46a, and 48a can be equal to or higher than that of each of the MOS FETs 32a, 34a, 36a, and 38a.

The second cascode circuit 30B includes a third PMOS FET 32b, a fourth PMOS FET 34b, a third NMOS FET 36b, a fourth NMOS FET 38b, and a second regulation circuit 40b. The third PMOS FET 32b, the fourth PMOS FET 34b, the third NMOS FET 36b, and the fourth NMOS FET 38b are connected in series between the first terminal 31b and the second terminal 39b. The third PMOS FET 32b and the fourth PMOS FET 34b can be implemented in a stack structure and the third NMOS FET 36b and the fourth NMOS FET 38b can be implemented in a stack structure.

The second regulation circuit 40b outputs a third control signal CTRL3 for stabilizing the voltage at a drain X3 of the third PMOS FET 32b to a gate of the fourth PMOS FET 34b based on a voltage of the drain X3 of the third PMOS FET 32b. The second regulation circuit 40b also outputs a fourth control signal CTRL4 for stabilizing the voltage at a source X4 of the third NMOS FET 36b to a gate of the third NMOS FET 36b based on a voltage of the source X4 of the third NMOS FET 36b.

The second regulation circuit 40b includes a plurality of MOS FETs 42b, 44b, 46b, and 48b, a third current source 41b, and a fourth current source 50b. The third current source 41b is connected between the first terminal 31b and a third node NC and the fourth current source 50b is connected between the second terminal 39b and a fourth node ND.

The seventh PMOS FET 42b is connected between the third node NC and the gate of the fourth PMOS FET 34b. The eighth PMOS FET 44b is connected between the third node NC and the gate of the third NMOS FET 36b and has a gate connected to the source X4 of the third NMOS FET 36b. The seventh NMOS FET 46b is connected between the fourth node ND and the gate of the fourth PMOS FET 34b and has a gate connected to the drain X3 of the third PMOS FET 32b. The eighth NMOS FET 48b is connected between the fourth node ND and the gate of the third NMOS FET 36b.

A first bias voltage $Vb_{1b}$ is input to a gate of the third PMOS FET 32b and a gate of the fourth NMOS FET 38b. Alternatively, a bias voltage applied to the gate of the third PMOS FET 32b can be different from a bias voltage applied to the gate of the fourth NMOS FET 38b. A second bias voltage $Vb_{2b}$ is applied to a gate of the seventh PMOS FET 42b and a gate of the eighth NMOS FET 48b. Alternatively, a bias voltage applied to the gate of the seventh PMOS FET 42b can be different from a bias voltage applied to the gate of the eighth NMOS FET 48b. As described above with reference to FIG. 3, the threshold voltage of each of the MOS FETs 42b, 44b, 46b, and 48b can be equal to or higher than that of each of the MOS FETs 32b, 34b, 36b, and 38b.

The differential amplifier 60 includes NMOS FETs 52 and 54 and a current source 56. The NMOS FET 52 is connected between the drain X1a of the first PMOS FET 32a and a node NE and the NMOS FET 54 is connected between the drain X3 of the third PMOS FET 32b and the node NE. The current source 56 is connected between the node NE and the second terminal 39b. The differential amplifier outputs to the drain X1a of the first PMOS FET 32a a first differential signal among differential output signals corresponding to differential input signals Vin and Vip and outputs to the drain X3 of the third PMOS FET 32b a second differential signal among the differential output signals.

Similar to the operation described above with reference to FIG. 3, when a voltage of the drain X1a of the first PMOS FET 32a increases, the first regulation circuit 40a outputs the first control signal CTRL1a for decreasing the voltage of the drain X1a of the first PMOS FET 32a to the gate of the second PMOS FET 34a. When the voltage of the drain X1a of the first PMOS FET 32a decreases, the first regulation circuit 40a outputs the first control signal CTRL1a for increasing the voltage of the drain X1 of the first PMOS FET 32a to the gate of the second PMOS FET 34a. In other words, the first regulation circuit 40a outputs the first control signal CTRL1a for stabilizing the voltage of the drain X1a of the first PMOS FET 32a to the gate of the second PMOS FET 34a based on the voltage change in the drain X1a of the first PMOS FET 32a.

When a voltage of the source X2a of the first NMOS FET 36a increases, the first regulation circuit 40a outputs the second control signal CTRL2a for decreasing the voltage of the source X2a of the first NMOS FET 36a to the gate of the first NMOS FET 36a. When the voltage of the source X2a of the first NMOS FET 36a decreases, the first regulation circuit 40a outputs the second control signal CTRL2a for increasing the voltage of the source X2a of the first NMOS FET 36a to the gate of the first NMOS FET 36a. In other words, the first regulation circuit 40a outputs the second control signal CTRL2a for stabilizing the voltage of the source X2a of the first NMOS FET 36a to the gate of the first NMOS FET 36a based on the voltage change in the source X2a of the first NMOS FET 36a.

The first control signal CTRL1a and the second control signal CTRL2a can be output at the same time or at different timing.

The second regulation circuit 40b outputs the third control signal CTRL3 and/or the fourth control signal CTRL4 to stabilize the voltage change in the drain X3 of the third PMOS FET 32b and/or the source X4 of the third NMOS FET 36b. The voltage of the drain X3 of the third PMOS FET 32b is stabilized or maintained substantially constant by the fourth PMOS FET 34b operating in response to the third control signal CTRL3. The voltage of the source X4 of the third NMOS FET 36b is stabilized or maintained substantially constant by the third NMOS FET 36b operating in response to the fourth control signal CTRL4. In FIGS. 3 and 4, a PMOS FET can be replaced with an NMOS FET and an NMOS FET can be replaced with a PMOS FET.

As described above, a regulated cascode circuit according to the present invention has reliable high output resistance even at a low voltage of less than 1 V without an increase in an area. In addition, since the regulated cascode circuit is isolated from power lines, a PSRR is remarkably increased. Moreover, the regulated cascode circuit can operate in a strong inversion region without any loss in an output voltage swing.

While the present invention has been particularly shown and described with reference to exemplary embodiments thereof, it will be understood by those of ordinary skill in the art that various changes in form and details can be made therein without departing from the spirit and scope of the present invention, as defined by the following claims. It is intended by the following claims to claim that which is literally described and all equivalents thereto, including all modifications and variations that fall within the scope of each claim.

What is claimed is:

1. A regulated cascode circuit comprising:
   a first PMOS FET and a second PMOS FET connected in series between an output terminal and a first terminal configured to receive a first supply voltage;
   a first NMOS FET and a second NMOS FET connected in series between the output terminal and a second terminal configured to receive a second supply voltage; and
   a regulation circuit configured to:
      output a first control signal to a gate of the second PMOS FET that is based on a voltage of a drain of the second PMOS FET, wherein the first control signal is configured to stabilize the voltage at the drain of the first PMOS FET; and
      output a second control signal to a gate of the first NMOS FET that is based on a voltage of a source of the first NMOS FET, wherein the second control signal is configured to stabilize the voltage at the source of the first NMOS FET.

2. The regulated cascode circuit of claim 1, wherein a bias voltage is input to at least one gate among a gate of the first PMOS FET and a gate of the second NMOS FET.

3. The regulated cascode circuit of claim 1, wherein an input voltage is input to a gate of the second NMOS FET.

4. The regulated cascode circuit of claim 1, wherein the regulation circuit comprises:
   a first current source connected between the first terminal and a first node;
   a second current source connected between the second terminal and a second node;

a third PMOS FET connected between the first node and the gate of the second PMOS FET;

a fourth PMOS FET connected between the first node and the gate of the first NMOS FET, the fourth PMOS FET having a gate connected to the source of the first NMOS FET;

a third NMOS FET connected between the second node and the gate of the second PMOS FET, the third NMOS FET having a gate connected to the drain of the first PMOS FET; and a fourth NMOS FET connected between the second node and the gate of the first NMOS FET.

5. The regulated cascode circuit of claim 4, wherein a threshold voltage of each of the third PMOS FET, the fourth PMOS FET, the third NMOS FET, and the fourth NMOS FET is equal to or higher than a threshold voltage of each of the first PMOS FET, the second PMOS FET, the first NMOS FET, and the second NMOS FET.

6. The regulated cascode circuit of claim 5, wherein a bias voltage is input to a gate of the third PMOS FET and a gate of the fourth NMOS FET.

7. A regulated cascode circuit comprising:

a first PMOS FET connected between a first node and a first terminal that receives a first supply voltage, the first PMOS FET having a gate that receives a first bias voltage;

a second PMOS FET connected between the first node and an output node;

a first NMOS FET connected between the output node and a second node;

a second NMOS FET connected between the second node and a second terminal that receives a second supply voltage, the second NMOS FET having a gate that receives an input signal;

a first current source connected between the first terminal and a third node;

a second current source connected between the second terminal and a fourth node;

a third PMOS FET connected between the third node and a gate of the second PMOS FET, the third PMOS FET having a gate that receives a second bias voltage;

a fourth PMOS FET connected between the third node and a gate of the first NMOS FET, the fourth PMOS FET having a gate connected to the second node;

a third NMOS FET connected between the fourth node and the gate of the second PMOS FET, the third NMOS FET having a gate connected to the first node; and a fourth NMOS FET connected between the fourth node and a gate of the first NMOS FET, the fourth NMOS FET having a gate that receives the second bias voltage.

8. The regulated cascode circuit of claim 7, wherein a threshold voltage of each of the third PMOS FET, the fourth PMOS FET, the third NMOS FET, and the fourth NMOS FET is equal to or higher than a threshold voltage of each of the first PMOS FET, the second PMOS FET, the first NMOS FET, and the second NMOS FET.

9. A method of regulating a cascode circuit, the method comprising:

providing a first PMOS FET and a second PMOS FET connected in series between a first terminal and an output terminal, the first terminal configured for receiving a first supply voltage;

providing a first NMOS FET and a second NMOS FET connected in series between the output terminal and a second terminal configured to receive a second supply voltage; and stabilizing a voltage at a drain of the first PMOS FET by outputting a first control signal to a gate of the second PMOS FET that is based on the voltage at the drain of the first PMOS FET; and stabilizing a voltage at a source of the first NMOS FET by outputting a second control signal to a gate of the first NMOS FET that is based on the voltage at the source of the first NMOS FET.

10. The method of claim 9, further comprising inputting a bias voltage to at least one gate among a gate of the first PMOS FET and a gate of the second NMOS FET.

11. The method of claim 9, further comprising inputting an input voltage to a gate of the second NMOS FET.

12. The method of claim 9, further comprising:

providing a first current source connected between the first terminal and a first node;

providing a second current source connected between the second terminal and a second node;

providing a third PMOS FET connected between the first node and the gate of the second PMOS FET;

providing a fourth PMOS FET connected between the first node and the gate of the first NMOS FET and having a gate connected to the source of the first NMOS FET;

providing a third NMOS FET connected between the second node and the gate of the second PMOS FET and having a gate connected to the drain of the first PMOS FET; and providing a fourth NMOS FET connected between the second node and the gate of the first NMOS FET.

13. The method of claim 12, further comprising defining a threshold voltage of each of the third PMOS FET, the fourth PMOS FET, the third NMOS FET, and the fourth NMOS FET that is equal to or higher than a threshold voltage of each of the first PMOS FET, the second PMOS FET, the first NMOS FET, and the second NMOS FET.

14. The method of claim 13, further comprising inputting a bias voltage to a gate of the third PMOS FET and a gate of the fourth NMOS FET.

* * * * *